US012738441B2

(12) United States Patent
Nishitani

(10) Patent No.: US 12,738,441 B2
(45) Date of Patent: Sep. 15, 2026

(54) ELECTRON BEAM APPLICATOR AND CREATION METHOD OF DETECTION DATA IN ELECTRON BEAM APPLICATOR

(71) Applicant: PHOTO ELECTRON SOUL INC., Nagoya (JP)

(72) Inventor: Tomohiro Nishitani, Nagoya (JP)

(73) Assignee: Photo electron Soul Inc., Nagoya (JP)

( * ) Notice: Subject to any disclaimer, the term of this patent is extended or adjusted under 35 U.S.C. 154(b) by 317 days.

(21) Appl. No.: 18/702,780

(22) PCT Filed: Oct. 17, 2022

(86) PCT No.: PCT/JP2022/038536
§ 371 (c)(1),
(2) Date: Apr. 18, 2024

(87) PCT Pub. No.: WO2023/068218
PCT Pub. Date: Apr. 27, 2023

(65) Prior Publication Data
US 2024/0412939 A1 Dec. 12, 2024

(30) Foreign Application Priority Data
Oct. 19, 2021 (JP) ................................ 2021-170831

(51) Int. Cl.
*H01J 1/34* (2006.01)
*H01J 37/073* (2006.01)
(Continued)

(52) U.S. Cl.
CPC .............. *H01J 37/073* (2013.01); *H01J 1/34* (2013.01); *H01J 37/244* (2013.01); *H01J 37/28* (2013.01);
(Continued)

(58) Field of Classification Search
CPC .......... H01J 37/073; H01J 1/34; H01J 37/244; H01J 37/28; H01J 2201/342; H01J 2237/06333; H01J 2237/24495
See application file for complete search history.

(56) References Cited

U.S. PATENT DOCUMENTS 11,417,495 B2 8/2022 Inoue et al.
2001/0038263 A1 11/2001 Lee et al.
(Continued)

FOREIGN PATENT DOCUMENTS

EP 4310882 A1 1/2024
JP H10-134757 A 5/1998
(Continued)

OTHER PUBLICATIONS

International Search Report, dated Dec. 6, 2022 for corresponding International Application No. PCT/JP2022/038536 with English translation (4 pages).
(Continued)

*Primary Examiner* — Nicole M Ippolito
(74) *Attorney, Agent, or Firm* — INTELLECTUAL PROPERTY LAW GROUP LLP

(57) ABSTRACT

This electron beam applicator includes: a light source; a photocathode; an anode; a detector; and a control unit. The photocathode receives two or more pulsed excitation light beams, and are emitted so that the excitation light beams are received by the photocathode at different timings, the control unit sets two or more irradiation regions and causes two or more pulsed electron beams formed in response to receiving the two or more pulsed excitation light beams of the different timings to be emitted to different irradiation regions, respectively, the detector generates detection signals by detecting, at different timings, pulsed emitted substances emitted from the different irradiation regions and outputs the generated detection signals in association with position information on
(Continued)

the different irradiation regions, and the number of detectors is less than the number of electron beams emitted to the irradiation targets.

20 Claims, 4 Drawing Sheets

(51) Int. Cl.
*H01J 37/24* (2006.01)
*H01J 37/244* (2006.01)
*H01J 37/28* (2006.01)

(52) U.S. Cl.
CPC .................... *H01J 2201/342* (2013.01); *H01J 2237/06333* (2013.01); *H01J 2237/24495* (2013.01)

(56) References Cited

U.S. PATENT DOCUMENTS

| | | | | |
|---|---|---|---|---|
| 2014/0097342 | A1* | 4/2014 | Tsuno | G01B 15/04 250/307 |
| 2014/0158883 | A1 | 6/2014 | Zewail | |
| 2016/0172144 | A1 | 6/2016 | Nishitani | |
| 2020/0080949 | A1 | 3/2020 | Nishitani et al. | |
| 2022/0059317 | A1* | 2/2022 | Shouji | H01J 37/28 |
| 2022/0270847 | A1 | 8/2022 | Ikeda et al. | |
| 2023/0266291 | A1* | 8/2023 | Myrick | G01N 31/223 |

FOREIGN PATENT DOCUMENTS

| | | | |
|---|---|---|---|
| JP | 2002500817 | A | 1/2002 |
| JP | 3537779 | B2 | 3/2004 |
| JP | 5808021 | B2 | 11/2015 |
| JP | 6925090 | B1 | 8/2021 |
| TW | 202138798 | A | 10/2021 |
| WO | WO 2019/131410 | A1 | 7/2019 |
| WO | WO 2021/024397 | A1 | 2/2021 |
| WO | WO 2021/084684 | A1 | 5/2021 |

OTHER PUBLICATIONS

Written Opinion of the ISA, dated Dec. 6, 2022 for corresponding International Application No. PCT/JP2022/038536 with English summary translation (4 pages).

Japan Office Action issued by the JPO, dated Dec. 1, 2021 for corresponding Japanese Patent Application No. 2021-170831 with English translation (6 pages).

Taiwan Office Action issued by TIPO, dated Jan. 9, 2026, for the corresponding Taiwanese Application No. 111139267 (10 pages).

* cited by examiner

ELECTRON BEAM APPLICATOR AND CREATION METHOD OF DETECTION DATA IN ELECTRON BEAM APPLICATOR

CROSS-REFERENCE TO RELATED APPLICATIONS

This application is a U.S. National Phase application, under 35 U.S.C. § 371, of International Application no. PCT/JP2022/038536, with an international filing date of Oct. 17, 2022, and claims priority to Japanese application no. 2021-170831 filed on Oct. 19, 2021, each of which is hereby incorporated by reference for all purposes.

TECHNICAL FIELD

The disclosure in the present application relates to an electron beam applicator and a creation method of detection data in an electron beam applicator.

BACKGROUND ART

Electron beam applicators that use an electron beam to acquire detection data from an irradiation target such as a sample are known.

As a related art, Patent Literature 1 discloses a multi-beam inspection device having an irradiation system that irradiates a plurality of measurement points on a sample with charged particle radiation and a plurality of detectors that detect secondary electrons or reflected charged particles from the sample. Patent Literature 1 discloses that, since a plurality of measurement points are irradiated in parallel with charged particle radiation, there is an advantage of being able to perform defect inspection or the like on a sample at a high throughput.

Further, Patent Literature 2 discloses that, in a multibeam charged particle beam device, a plurality of detection elements corresponding to multiple beams are two-dimensionally arranged.

Electron guns with a photocathode are known besides electron guns of thermionic emission types, field emission (FE) types, and Schottky types. Patent Literature 3 discloses an electron gun with a photocathode. The electron gun with a photocathode disclosed in Patent Literature 3 can emit a bright, sharp electron beam by irradiating the photocathode with an excitation light beam.

CITATION LIST

Patent Literature

Patent Literature 1: Japanese Patent Application Laid-Open No. 10-134757

Patent Literature 2: International Publication No. 2021/024397

Patent Literature 3: Japanese Patent No. 5808021

SUMMARY OF INVENTION

Technical Problem

The inventions disclosed in Patent Literatures 1 and 2 intend to improve the throughput by using a plurality of detectors (detection elements) corresponding to multiple beams. In the inventions disclosed in Patent Literatures 1 and 2, however, there is a problem that the required number of detectors (detection elements) is at least the number of electron beams emitted to an irradiation target or greater. On the other hand, the electron gun with a photocathode disclosed in Patent Literature 3 is under development. In electron beam applicators on which an electron gun with a photocathode is mounted, development of a creation method of significant detection data corresponding to multiple beams is desired.

The present application has been made to solve the above problems, and according to intensive study, it has been newly found that (1) when a photocathode receives two or more pulsed excitation light beams that differ in irradiation timings, the photocathode can form two or more pulsed electron beams reflecting the irradiation timings of the excitation light beams, (2) when the two or more formed pulsed electron beams are emitted to different irradiation regions of an irradiation target, irradiation timings of the electron beams emitted to respective irradiation regions differ from each other, (3) since the irradiation timings of the electron beams differ from each other, pulsed emitted substances in accordance with the irradiation timings of the electron beams are obtained from the different irradiation regions of the irradiation target, and (4) as a result, since detection signals can be generated by a single detector from two or more emitted substances obtained from the different irradiation regions of the irradiation target, the number of detectors can be less than the number of electron beams to be emitted.

The disclosure of the present application is to provide a novel electron beam applicator and a novel creation method of detection data in an electron beam applicator that utilize the feature of a photocathode.

Solution to Problem

The disclosure in the present application relates to an electron beam applicator and a creation method of detection data in an electron beam applicator illustrated below.

(1) An electron beam applicator including:

at least one light source;

a photocathode configured to generate releasable electrons in response to receiving an excitation light beam emitted from the light source;

an anode configured to form an electric field between the photocathode and the anode and extract the releasable electrons by the formed electric field to form an electron beam;

a detector configured to detect an emitted substance emitted from an irradiation target irradiated with the electron beam and generate a detection signal; and a control unit, wherein the photocathode receives two or more excitation light beams, wherein the two or more excitation light beams are pulsed, respectively, and are emitted so that the excitation light beams are received by the photocathode at different timings, wherein the control unit sets two or more irradiation regions to be irradiated with an electron beam in the irradiation target in one detection data creation operation, and causes two or more pulsed electron beams to be emitted to different irradiation regions selected from the set two or more irradiation regions, respectively, the two or more pulsed electron beams being formed in response to receiving the two or more pulsed excitation light beams of the different timings, wherein the detector generates detection signals by detecting, at different timings, pulsed emitted substances emitted from the different irradiation regions of the irradiation target, and outputs the generated detection signals in association with position information on the different irradiation regions, and wherein the number of detectors is less than the number of electron beams emitted to the irradiation targets.

(2) The electron beam applicator according to (1) above, wherein the number of detectors is one.

(3) The electron beam applicator according to (1) or (2) above, wherein two or more light sources are provided, and excitation light beams emitted from respective light sources are emitted so that the excitation light beams are received by the photocathode at different timings.

(4) The electron beam applicator according to (1) or (2) above, wherein one light source is provided, an excitation light beam emitted from the light source is divided into two or more, and the divided two or more excitation light beams are emitted so that the excitation light beams are received by the photocathode at different timings.

(5) The electron beam applicator according to (1) or (2) above, wherein the electron beam applicator is a scanning electron microscope,
an electron beam inspection device,
an Auger electron spectrometer,
a cathodoluminescence device,
an X-ray analyzer,
a transmission electron microscope, or
a scanning transmission electron microscope.

(6) The electron beam applicator according to (3) above, wherein the electron beam applicator is a scanning electron microscope,
an electron beam inspection device,
an Auger electron spectrometer,
a cathodoluminescence device,
an X-ray analyzer,
a transmission electron microscope, or
a scanning transmission electron microscope.

(7) The electron beam applicator according to (4) above, wherein the electron beam applicator is a scanning electron microscope,
an electron beam inspection device,
an Auger electron spectrometer,
a cathodoluminescence device,
an X-ray analyzer,
a transmission electron microscope, or
a scanning transmission electron microscope.

(8) A creation method of detection data in an electron beam applicator, wherein the electron beam applicator includes at least one light source, a photocathode configured to generate releasable electrons in response to receiving an excitation light beam emitted from the light source, an anode configured to form an electric field between the photocathode and the anode and extract the releasable electrons by the formed electric field to form an electron beam, a detector configured to detect an emitted substance emitted from an irradiation target irradiated with the electron beam and generate a detection signal, and a control unit, the creation method of detection data including:

a step of setting two or more irradiation regions to be irradiated with an electron beam in the irradiation target in one detection data creation operation;

an electron beam forming step of forming two or more pulsed electron beams by emitting two or more excitation light beams from the light source to the photocathode, the two or more excitation light beams being pulsed and being set to be received by the photocathode at different timings;

an electron beam irradiation step of irradiating different irradiation regions selected from the set two or more irradiation regions with the two or more pulsed electron beams, respectively;

a detection step of detecting, at different timings by the detector, pulsed emitted substances emitted from the different irradiation regions in response to irradiation with the two or more pulsed electron beams and generating detection signals; and a detection data output step of outputting the generated detection signals in association with position information on the different irradiation regions, wherein the number of detectors is less than the number of electron beams emitted to the irradiation targets.

(9) The creation method of detection data according to (8) above, wherein the number of detectors is one.

(10) The creation method of detection data according to (8) or (9) above, wherein two or more light sources are provided, and excitation light beams emitted from respective light sources are emitted so that the excitation light beams are received by the photocathode at different timings.

(11) The creation method of detection data according to (8) or (9) above, wherein one light source is provided, an excitation light beam emitted from the light source is divided into two or more, and the divided two or more excitation light beams are emitted so that the excitation light beams are received by the photocathode at different timings.

(12) The creation method of detection data according to (8) or (9) above, wherein the electron beam applicator is a scanning electron microscope,
an electron beam inspection device,
an Auger electron spectrometer,
a cathodoluminescence device,
an X-ray analyzer,
a transmission electron microscope, or
a scanning transmission electron microscope.

(13) The creation method of detection data according to (10), wherein the electron beam applicator is a scanning electron microscope,
an electron beam inspection device,
an Auger electron spectrometer,
a cathodoluminescence device,
an X-ray analyzer,
a transmission electron microscope, or
a scanning transmission electron microscope.

(14) The creation method of detection data according to (11) above, wherein the electron beam applicator is a scanning electron microscope,
an electron beam inspection device,
an Auger electron spectrometer,
a cathodoluminescence device,
an X-ray analyzer,
a transmission electron microscope, or
a scanning transmission electron microscope.

Advantageous Effect

The electron beam applicator and the creation method of detection data in the electron beam applicator disclosed in the present application can reduce the number of detectors to be less than the number of electron beams to be emitted.

DESCRIPTION OF EMBODIMENTS

Figure 1:
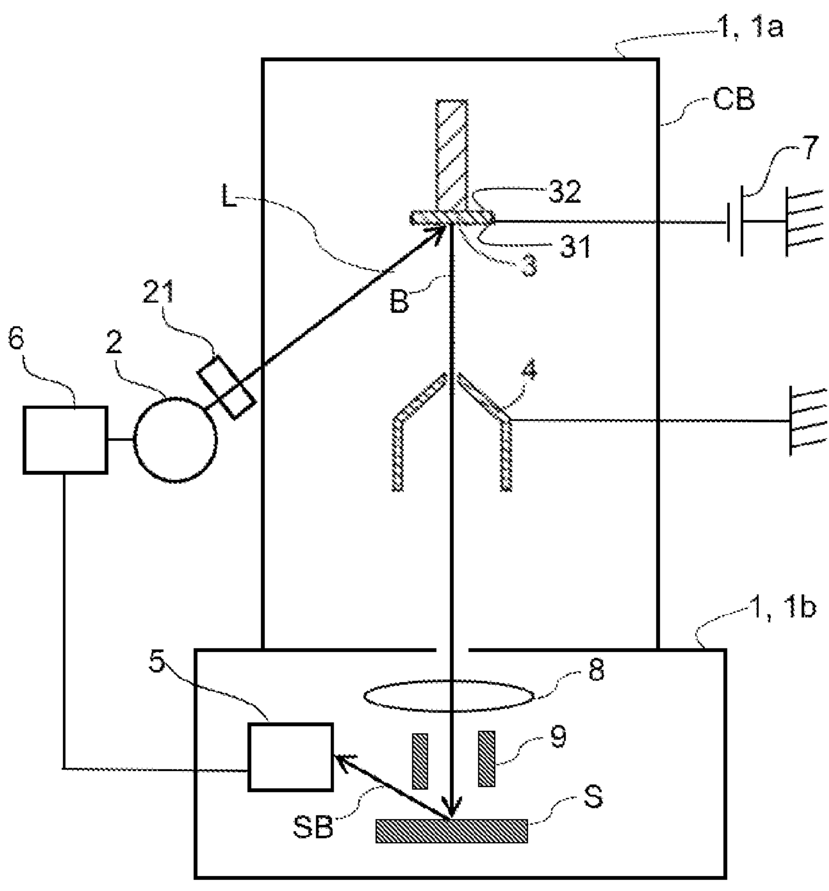
FIG. 1 is a diagram schematically illustrating an electron beam applicator 1 according to an embodiment.

An electron beam applicator and a creation method of detection data in the electron beam applicator (hereafter, which may be referred to as "detection data creation method") will be described in detail below with reference to the drawings. Note that, in the present specification, members having the same type of functions are labeled with the same or similar references. Further, duplicated description for the members labeled with the same or similar references may be omitted.

Further, the position, size, range, or the like of respective components illustrated in the drawings may be depicted differently from the actual position, size, range, or the like for easier understanding. Thus, the disclosure in the present application is not necessarily limited to the position, size, range, or the like disclosed in the drawings.

Embodiment of Electron Beam Applicator and Detection Data Creation Method

Figure 2:
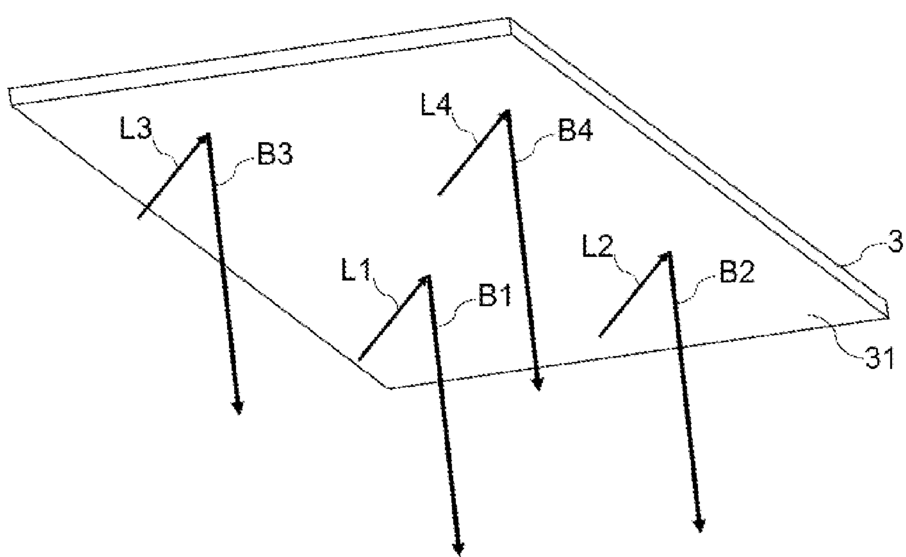
FIG. 2 is a diagram illustrating an overview of a detection data creation method (details of control performed by a control unit 6) in the electron beam applicator according to the embodiment.
Figure 3:
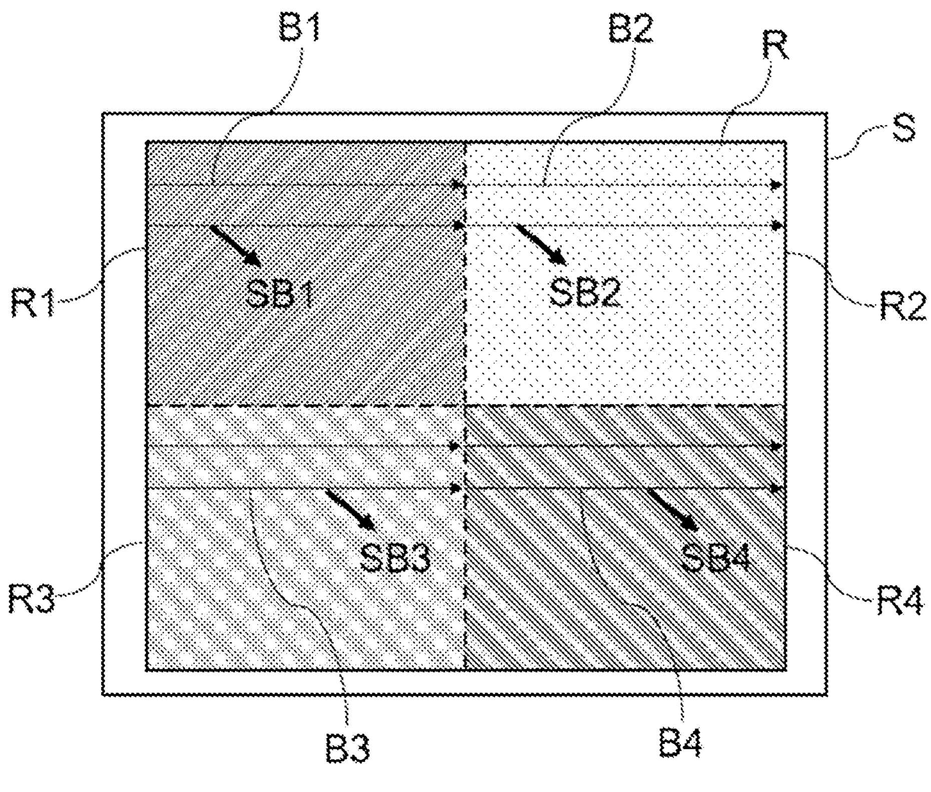
FIG. 3 is a diagram illustrating an overview of the detection data creation method (details of control performed by the control unit 6) in the electron beam applicator according to the embodiment.
Figure 4:
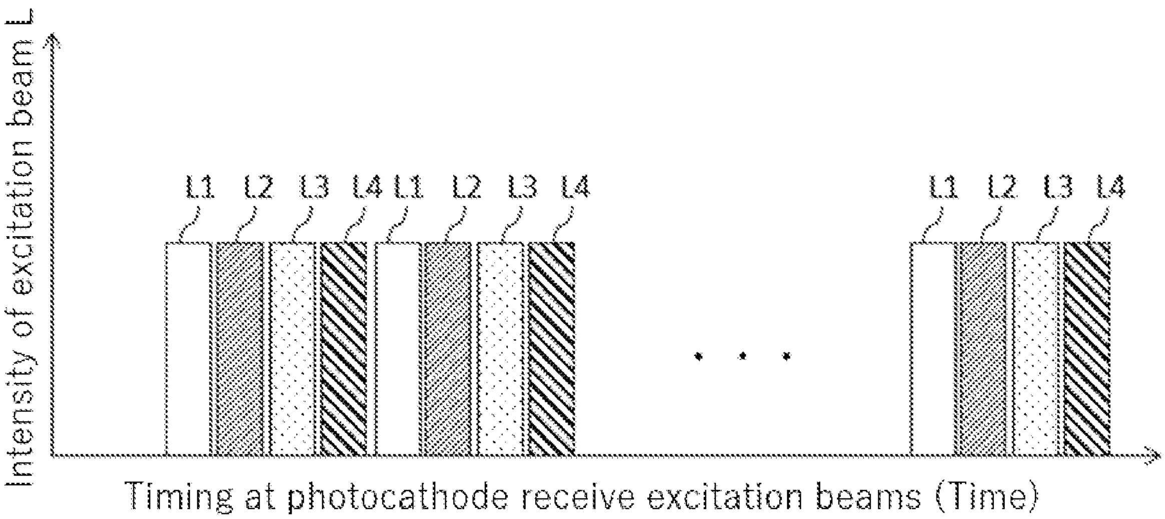
FIG. 4 is a diagram illustrating that detection signals can be generated by a single detector from two or more emitted substances obtained from different irradiation regions of an irradiation target.
Figure 5:
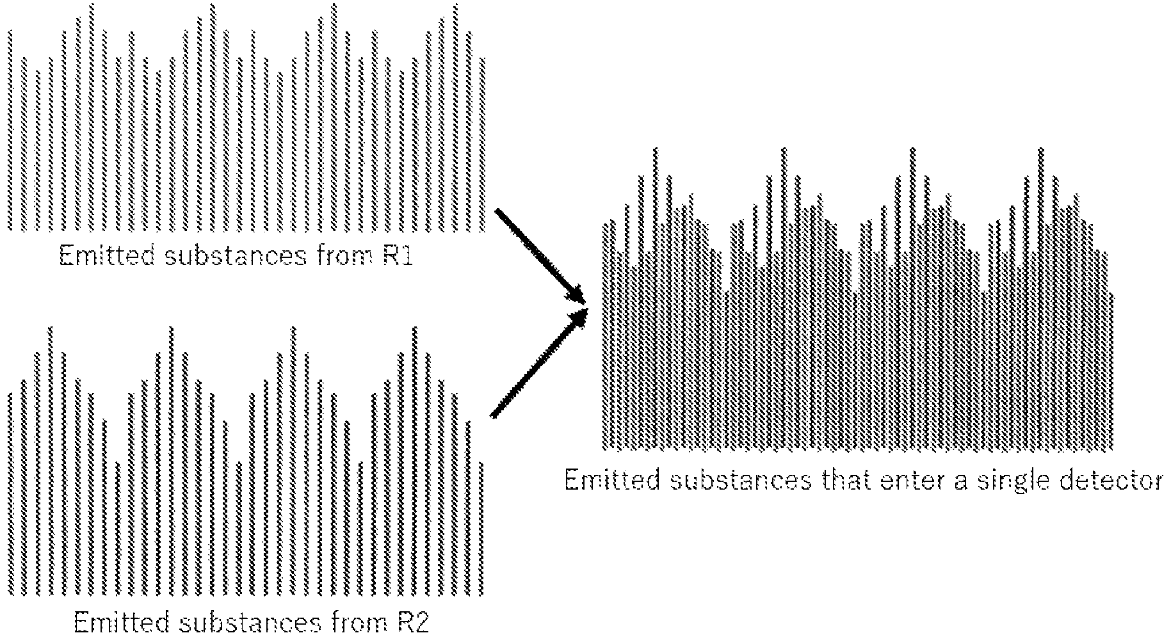
FIG. 5 is a diagram illustrating that detection signals can be generated by a single detector from two or more emitted substances obtained from different irradiation regions of an irradiation target.
Figure 6:
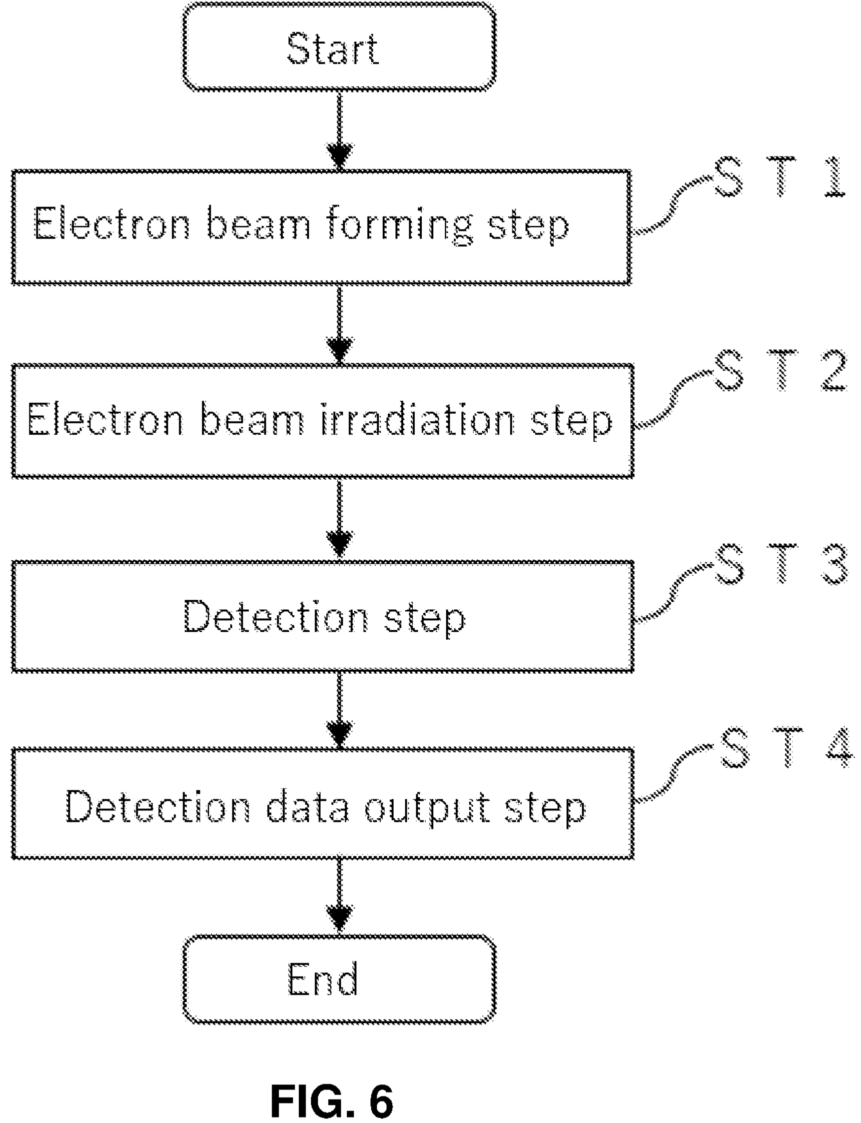
FIG. 6 is a flowchart of the detection data creation method.

Embodiments of the electron beam applicator and the detection data creation method will be described with reference to FIG. 1 to FIG. 6. FIG. 1 is a diagram schematically illustrating an electron beam applicator 1 according to the embodiment. FIG. 2 and FIG. 3 are diagrams illustrating the overview of the detection data creation method (details of control performed by a control unit 6) in the electron beam applicator according to the embodiment. FIG. 4 and FIG. 5 are diagrams illustrating that detection signals can be generated by a single detector from emitted substances obtained from two or more different irradiation regions of an irradiation target, respectively. FIG. 6 is a flowchart of the detection data creation method.

The embodiment of the electron beam applicator 1 illustrated in FIG. 1 includes at least a light source 2, a photocathode 3, an anode 4, a detector 5, and a control unit 6. Note that FIG. 1 illustrates an example in which the electron beam applicator 1 is formed separately of an electron gun portion 1*a* and a counterpart device 1*b* (the remaining portion of the electron beam applicator 1 when the electron gun portion 1*a* is removed). Alternatively, the electron beam applicator 1 may be formed in an integrated manner. Further, the electron beam applicator 1 may be optionally, additionally provided with a power supply 7 for generating an electric field between the photocathode 3 and the anode 4, an objective lens 8 for converging an electron beam B into an irradiation target S, and an electron beam deflector 9 for scanning the irradiation target S with the electron beam B. Furthermore, although depiction is omitted, a known component in accordance with the type of the electron beam applicator 1 may be included. Note that, since the example illustrated in FIG. 1 illustrates the overview of the entire electron beam applicator 1, the number of electron beams B emitted from the photocathode 3 is one. The overview of the detection data creation method (details of control performed by the control unit 6) in the electron beam applicator according to the embodiment will be described in detail with reference to FIG. 2 to FIG. 5.

The light source 2 is not particularly limited as long as it can irradiate the photocathode 3 with an excitation light beam L to cause emission of the electron beam B. The light source 2 may be, for example, a high power (watt class), high frequency (several hundred MHz), ultrashort pulse laser light source, a relatively inexpensive laser diode, an LED, or the like. The excitation light beam L can be pulsed light when received at the photocathode 3. Thus, when the light source 2 emits continuous light, a liquid crystal shutter or the like can be provided between the light source 2 and the photocathode 3. Note that, in the example illustrated in FIG. 1, the light source 2 is arranged outside a vacuum chamber CB, and a first face 31 (a face on the anode 4 side) side of the photocathode 3 is irradiated with the excitation light beam L. Alternatively, the light source 2 may be arranged inside the vacuum chamber CB. Further, a second face 32 (a face on the opposite side of the anode 4) side of the photocathode 3 may be irradiated with the excitation light beam L.

The photocathode 3 generates releasable electrons in response to receiving the excitation light beam L emitted from the light source 2. The principle of the photocathode 3 generating releasable electrons in response to receiving the excitation light beam L is well known (for example, see Japanese Patent No. 5808021 and the like).

The photocathode 3 is formed of a substrate of quartz glass, sapphire glass, or the like and a photocathode film (not illustrated) adhered to the first face 31 of the substrate. The photocathode material for forming the photocathode film is not particularly limited as long as it can generate releasable electrons in response to irradiation with an excitation light beam and may be a material requiring EA surface treatment, a material not requiring EA surface treatment, or the like. The material requiring EA surface treatment may be, for example, Group III-V semiconductor materials or Group II-VI semiconductor materials. Specifically, the material may be AlN, $Ce_2Te$, GaN, a compound of one or more types of alkaline metals and Sb, or AlAs, GaP, GaAs, GaSb, InAs, or the like, and a mixed crystal thereof, or the like. The material may be a metal as another example and specifically may be Mg, Cu, Nb, $LaB_6$, $SeB_6$, Ag, or the like. The photocathode 3 can be fabricated by applying EA surface treatment on the photocathode material described above. For the photocathode 3, suitable selection of the semiconductor material or the structure thereof makes it possible not only to select an excitation light beam in a range from near-ultraviolet to infrared wavelengths in accordance with gap energy of the semiconductor but also to achieve electron beam source performance (quantum yield, durability, monochromaticity, time response, spin polarization) in accordance with the use of the electron beam.

Further, the material not requiring EA surface treatment may be, for example, a single metal, an alloy, or a metal compound of Cu, Mg, Sm, Tb, Y, or the like or diamond, WBaO, $Cs_2Te$, or the like. The photocathode not requiring EA surface treatment can be fabricated by a known method (for example, see Japanese Patent No. 3537779 and the like). The content disclosed in Japanese Patent No. 3537779 is incorporated in the present specification in its entirety by reference.

Note that, regarding the reference to "photocathode" and "cathode" in the present specification, "photocathode" may be used when the reference in question means emission of the electron beam, and "cathode" may be used when the reference in question means the counter electrode of an "anode". Regarding the reference numeral, however, "3" is used for both cases of "photocathode" and "cathode".

The anode 4 is not particularly limited as long as it can generate an electric field together with the cathode 3, and any anode 4 generally used in the field of electron guns can be used. When an electric field is formed between the cathode 3 and the anode 4, the releasable electrons generated by irradiation with the excitation light beam L are extracted to the photocathode 3, and thereby the electron beam B is formed.

Although FIG. 1 illustrates the example in which the power supply 7 is connected to the cathode 3 in order to form an electric field between the cathode 3 and the anode 4, the arrangement of the power supply 7 is not particularly limited as long as a potential difference occurs between the cathode 3 and the anode 4.

The detector 5 detects an emitted substance SB emitted from the irradiation target S irradiated with the electron beam B. The emitted substance SB means a signal emitted from the irradiation target S in response to irradiation with the electron beam B and may represent, for example, secondary electrons, reflected electrons, characteristic X-rays, Auger electrons, cathodoluminescence, transmitted electrons, or the like. The detector 5 is not particularly limited as long as it can detect such emitted substances SB, and a known detector and a known detection method may be used.

Next, an example of the electron beam applicator 1 and the detection data creation method (more specifically, details of control performed by the control unit 6) according to the embodiment will be described in detail with reference to FIG. 2 to FIG. 5.

In the electron beam applicator 1 according to the embodiment, the number of excitation light beams L received by the photocathode 3 is two or greater. In the example illustrated in FIG. 2, the number of excitation light beams L received by the photocathode 3 is four (L1 to L4). The number of excitation light beams L received by the photocathode 3 is not particularly limited as long as it is two or greater and can be suitably selected such as three or greater, four or greater, five or greater, six or greater, seven of greater, eight or greater, nine or greater, or the like. A greater number of excitation light beams L received by the photocathode 3 results in a greater number of electron beams B emitted to different irradiation regions R of the irradiation target S in one detection data creation operation. This improves the flexibility in setting of irradiation regions R that can be used for creating detection data in one detection data creation operation. On the other hand, while there is no particular upper limit in the number of excitation light beams L received by the photocathode 3, an increase in the number of light sources 2 will result in higher manufacturing costs and a larger device size, as described later. Thus, while there is no particular upper limit from a technical point of view, the upper limit of the number of excitation light beams L received by the photocathode 3 can be set as appropriate from the viewpoint of manufacturing costs or the like.

To provide two or more excitation light beams L to be received by the photocathode 3, for example, it is sufficient to provide two or more light sources 2 that emits the excitation light beam L to the photocathode 3. Alternatively, as illustrated in FIG. 1, a beam splitter 21 may be arranged between a single light source 2 and the photocathode 3, and the excitation light beam L emitted from the single light source 2 may be divided into a desired number by the beam splitter 21. Also alternatively, two or more light sources 2 and the beam splitter 21 may be combined.

In the example illustrated in FIG. 2, the photocathode 3 generates releasable electrons in response to receiving four excitation light beams L1 to L4. Subsequently, due to an electric field formed between the cathode 3 and the anode 4, electrons are extracted from the photocathode 3, and four electron beams B1 to B4 are formed. As illustrated in FIG. 3, the four formed electron beams B1 to B4 are then emitted to different irradiation regions R1 to R4 of the irradiation target S, respectively. Note that, while the electron beam B emitted from the photocathode 3 has a feature of being less likely to be scattered than electron beams emitted from other types of electron guns, the objective lens 8 (see FIG. 1) may be used to converge the electron beams B1 to B4 before irradiation on the irradiation target S where necessary. When the objective lens 8 is used, it is sufficient to provide at least one objective lens 8 for two or more electron beams B.

When the electron beam applicator 1 is of the scanning type, the control unit 6 uses the electron beam deflector 9 to irradiate the different irradiation regions R1 to R4 of the irradiation target S while performing scanning with the electron beams B1 to B4 linearly, respectively. Then, from the irradiation regions R1 to R4 irradiated with the electron beams B1 to B4, emitted substances SB1 to SB4 such as secondary electrons are emitted, respectively. When the electron beam deflector 9 is provided, a single electron beam deflector 9 may be used to deflect two or more electron beams B, or the electron beam deflector 9 may be provided to each electron beam B. When the electron beam applicator 1 is a non-scanning type TEM or the like, since the size of the electron beam B emitted to the irradiation target S can be increased, it is not necessarily required to provide the electron beam deflector 9. The electron beam deflector 9 may be a known device such as, for example, a deflecting electrode that generates an electric field in a direction intersecting the traveling direction of the electron beam B.

The excitation light beam L and the electron beams B formed thereby will be described in more detail with reference to FIG. 2 to FIG. 4. In the electron beam applicator 1 according to the embodiment, the excitation light beams L1 to L4 to be received by the photocathode 3 are pulsed, respectively, and set to be received by the photocathode 3 at different timings. Note that "received by the photocathode 3 at different timings" in the present specification means that the photocathode 3 does not simultaneously receive two or more different excitation light beams (for example, L1 to L4; locations where the photocathode 3 receives the excitation light beams L1 to L4 are different). In other words, it means that excitation light beams (L1 to L4) to be received at different receiving locations are not received in an overlapped manner at any time on the time axis on which the photocathode 3 receives two or more different excitation light beams (L1 to L4).

Further, "pulsed" in the present specification means that a period during which the intensity of the excitation light beams (L1 to L4) is zero and a period during which the excitation light beam has a predetermined intensity occur alternatingly (note that, hereafter, alternatingly occurring timing may be referred to as a "frequency"; and one of the periods having a predetermined intensity may be referred to as a "pulse"). The shape of a pulse is not particularly limited as long as the emitted substances SB from which detection signals can be generated are obtained from the irradiation target S by an emitted electron beam B. Although the pulse is shaped in a substantially rectangular waveform in the example illustrated in FIG. 4, the pulse may be shaped in a sine curve. Although respective frequencies of the excitation light beams L1 to L4 are the same in the example illustrated in FIG. 4, the frequencies of the excitation light beams L1 to L4 may differ from each other as long as the excitation light beam is set to be received by the photocathode 3 at different timings. Further, in one excitation light beam (any one of L1 to L4), the frequency may be modulated with the time axis as long as the excitation light beams are set to be received by the photocathode 3 at different timings.

Although respective intensities of the excitation light beams L1 to L4 are the same in the example illustrated in FIG. 4, the intensities of pulses of the excitation light beams L1 to L4 may differ from each other. Further, in one excitation light beam (any one of L1 to L4), the intensity of the pulse may be modulated with the time axis.

As described above, the excitation light beams L1 to L4 are pulsed, respectively, and are emitted so that these excitation light beams are received by the photocathode 3 at different timings. Since the electron beams B1 to B4 corresponding to reception of the excitation light beams L1 to L4 are emitted from the photocathode 3, the emitted electron beams B1 to B4 are also pulsed electron beams at different timings. Therefore, the emitted electron beams B1 to B4 are emitted to the different irradiation regions R1 to R4 of the irradiation target S at different timings, respectively.

The method of emitting excitation light beams (L1 to L4) is not particularly limited as long as the excitation light beams (L1 to L4) are pulsed, respectively, and are emitted so that these excitation light beams are received by the photocathode 3 at different timings. For example, when two or more (in the example illustrated in FIG. 2, four) light sources 2 are provided, it is preferable to control the light sources 2 so that the pulses of the excitation light beams (L1 to L4) emitted from respective light sources 2 occur at different timings on the time axis. Note that the light sources 2 may be controlled by the control unit 6 described later where necessary. Further, when the beam splitter 21 is used with a single light source 2 to form two or more excitation light beams, for example, a liquid crystal shutter can be used as the beam splitter 21. The control unit 6 described later performs open-close control on the liquid crystal shutter to divide an excitation light beam into a plurality of excitation light beams (L1 to L4) and adjusts the open-close interval of the liquid crystal shutter for each excitation light beam (L1 to L4), and thereby the excitation light beam can be controlled to be received by the photocathode 3 at different timings.

An example of details of control performed by the control unit 6 will be described in detail with reference to FIG. 2 to FIG. 5. FIG. 5 illustrates an example in which the emitted substances SB emitted from the irradiation regions R1 and R2 enter a single detector. As described above, the electron beams B1 to B4 are emitted to the different irradiation regions R1 to R4 of the irradiation target S at different timings, respectively. Thus, as illustrated in FIG. 5, the emitted substances SB emitted from the irradiation regions R1 and R2 are also pulsed with the different timings. Therefore, since the emitted substances SB entering the single detector from the different irradiation regions R1 and R2 do not overlap, the pulsed emitted substances SB emitted from the different irradiation regions R1 and R2 can be detected at the different timings by the single detector, and detection signals can be generated. The control unit 6 controls which position of the irradiation regions R1 and R2 is to be irradiated with the electron beams B1 and B2. Therefore, by outputting the generated detection signals in association with position information on the irradiation regions R1 and R2, it is possible to create detection data by the detectors 5, the number of which is less than the number of electron beams B emitted to the irradiation target S. In the example illustrated in FIG. 5, detection signals of two emitted substances SB are generated by using a single detector. Even in the case of three or more emitted substances SB, by controlling the timings of the electron beams B emitted to the irradiation regions R so that the emitted substances SB entering the detector do not overlap in the same manner as in the example illustrated in FIG. 5, it is possible to generate detection signals from three or more emitted substances SB by using a single detector.

In Patent Literatures 1 and 2, it is required to provide detectors (detection elements), the number of which is greater than or equal to the number of electron beams B to be emitted to the irradiation target S. In contrast, as described above, in the electron beam applicator 1 according to the embodiment, the number of detectors 5 can be less than the number of electron beams B to be emitted to the irradiation target S. In a more preferable embodiment, it is possible to cope with multiple electron beams B by using a single detector 5.

The electron beam applicator 1 is not particularly limited as long as it can detect emitted substances such as secondary electrons, reflected electrons, characteristic X-rays, Auger electrons, cathodoluminescence, or transmitted electrons. Examples of the electron beam applicator 1 may be, for example, a scanning electron microscope, an electron beam inspection device, an Auger electron spectrometer, a cathodoluminescence device, an X-ray analyzer, a transmission electron microscope (TEM), a scanning transmission electron microscope (STEM), or the like. Note that, when non-scanning type device is used as the electron beam applicator 1, it is preferable to irradiate different irradiation regions R with two or more pulsed electron beams of different timings. This is the same as the case of the scanning type except for being the non-scanning type.

Next, the detection data creation method will be described with reference to FIG. 6. The detection data creation method includes an electron beam forming step (ST1), an electron beam irradiation step (ST2), a detection step (ST3), and a detection data output step (ST4). In the electron beam forming step (ST1), two or more excitation light beams L that are pulsed and are set to be received by the photocathode 3 at different timings are emitted from the light source 2 to the photocathode 3, and thereby two or more pulsed electron beams B are formed. As described above, the photocathode 3 can form the electron beam B reflecting the timing of the excitation light beam L. Therefore, in the electron beam forming step (ST1), two or more pulsed electron beams B of respective different timings can be formed. In the electron beam irradiation step (ST2), the two or more pulsed electron beams B are emitted to different irradiation regions R of the irradiation target S, respectively. In the detection step (ST3), the emitted substances SB emitted from the different irradiation regions R irradiated with two or more pulsed electron beams B, respectively, are detected by the detector 5, and detection signals are generated. The emitted substance SB emitted from the different irradiation regions R enter the detector 5 at different timings. In the detection data output step (ST4), the generated detection signals are output in association with position information on the different irradiation regions. Detection data covering the different irradiation regions R can be created based on the output data. Further, after the detection data output step (ST4), an image formation step of forming an image based on the detection data may be optionally, supplementally added.

Note that FIG. 1 to FIG. 5 represent a mere example of the electron beam applicator 1. Various modifications may be made as long as they are within the scope of the technical concept disclosed in the present application. For example, although the first face 31 side of the photocathode 3 is irradiated with the excitation light beam L in the example illustrated in FIG. 1, the second face 32 side may be irradiated. Further, although the emitted substance SB reflected from the irradiation target S is illustrated as an emitted substance SB in the example illustrated in FIG. 1, an emitted substance SB transmitted through the irradiation target S may be employed.

The electron beam applicator and the detection data creation method disclosed in the present application (hereafter, the device and the method may be collectively referred to as "electron beam applicator") achieve the following advantageous effects.

(1) In the conventional electron beam applicator in the multi-electron beam form, the required number of detectors (detection elements) is the same as or even greater than the number of the electron beams emitted to an irradiation target. In contrast, in the electron beam applicator 1 according to the embodiment, the number of detectors 5 can be less than the number of electron beams B emitted to the irradiation target S. The reduction in the number of detectors 5 enables a reduction in size of the electron beam applicator 1 and a reduction in costs.

(2) The conventional multi-electron beam system obtains a pulsed electron beam by using a mechanical shutter or the like from an electron beam B resulted after extracted from an electron gun. In contrast, the electron beam applicator 1 according to the embodiment uses the photocathode 3 and thus can form two or more electron beams B of different timings from the same photocathode 3 by changing the timing of the excitation light beam L emitted to the photocathode 3. Therefore, design of the electron beam B can be diversified. Further, the electron beam applicator 1 according to the embodiment can be implemented only by using the photocathode 3 and thus can be said to be the electron beam applicator 1 (detection data creation method) based on a novel principle using the nature specific to the photocathode 3.

(3) It is known that the photocathode 3 deteriorates with irradiation time of the excitation light beam L. When pulsed light is used as the excitation light beam L, there is no electron beam that is cut off by a mechanical shutter and is thus not used. Therefore, no component for pulsing the electron beam B is required, and the lifetime of the photocathode 3 is increased.

(4) In a case of a plurality of detectors 5, the process from signal detection to detection data creation (image processing) is required for the number of detectors 5. In contrast, in the case of the electron beam applicator 1 disclosed in the present application, the number of detectors 5 can be less than the number of electron beams B emitted to the irradiation target S. Therefore, signal processing is simplified, and thereby the entire operation of detection data creation can be simplified (expedited).

(5) In the electron beam applicator 1 with the photocathode 3, it is possible to create detection data on different irradiation regions R by using a single electron beam B. For example, in creation of detection data on the irradiation regions R1 and R3 of FIG. 3, detection data on the irradiation region R1 can be first created, and detection data on the irradiation region R3 can then be created. In such a case, however, in creating detection data on the irradiation regions R1 and R3, a time lag occurs. In contrast, in the electron beam applicator 1 disclosed in the present application, the timings are shifted from each other so that the pulsed electron beams B emitted to the different irradiation regions R1 and R3 of the irradiation target S do not overlap, and thereby detection data can be obtained at substantially the same time from the different irradiation regions R1 and R3 without any time lag. Therefore, the electron beam applicator 1 disclosed in the present application achieves an unexpected advantageous effect of being able to be used for uses and others in which the detection would be difficult because of a time lag in the conventional device using a single electron beam B, such as, for example, a use for detecting an impact on the irradiation region R3 when an electron beam B is applied to the irradiation region R1.

(6) With the use of the electron beam applicator 1 disclosed in the present application, detection data can be obtained from a desired irradiation region R of the irradiation target S without a time lag. Since detection data can be obtained without a time lag, the electron beam applicator 1 disclosed in the present application is useful in various uses other than the use described in (5) above.

INDUSTRIAL APPLICABILITY

The electron beam applicator and the detection data creation method disclosed in the present application can reduce the number of detectors to be less than the number of electron beams to be emitted. Therefore, the electron beam applicator and the detection data creation method disclosed in the present application are useful for industries in which handle electron beam applicators which create detection data.

List of References

| | |
|---|---|
| 1 | electron beam applicator |
| 1a | electron gun portion |
| 1b | counterpart device |
| 2 | light source |
| 21 | beam splitter |
| 3 | photocathode (cathode) |
| 31 | first face |
| 32 | second face |

-continued

| List of References | |
|---|---|
| 4 | anode |
| 5 | detector |
| 6 | control unit |
| 7 | power supply |
| 8 | objective lens |
| 9 | electron beam deflector |
| B, B1 to B4 | electron beam |
| CB | vacuum chamber |
| L, L1 to L4 | excitation light beam |
| S | irradiation target |
| SB, SB1 to SB4 | emitted substance |
| R, R1 to R4 | irradiation region |

The invention claimed is:

1. An electron beam applicator comprising:

at least one light source;

a photocathode configured to generate releasable electrons in response to receiving an excitation light beam emitted from the light source;

an anode configured to form an electric field between the photocathode and the anode and extract the releasable electrons by the formed electric field to form an electron beam;

a detector configured to detect an emitted substance emitted from an irradiation target irradiated with the electron beam and generate a detection signal; and a control unit, wherein the photocathode receives two or more excitation light beams, wherein the two or more excitation light beams are pulsed, respectively, and are emitted so that the excitation light beams are received by the photocathode at different timings, wherein the control unit sets two or more irradiation regions to be irradiated with an electron beam in the irradiation target in one detection data creation operation, and causes two or more pulsed electron beams to be emitted to different irradiation regions selected from the set two or more irradiation regions, respectively, the two or more pulsed electron beams being formed in response to receiving the two or more pulsed excitation light beams of the different timings, wherein the detector generates detection signals by detecting, at different timings, pulsed emitted substances emitted from the different irradiation regions of the irradiation target, and outputs the generated detection signals in association with position information on the different irradiation regions, and wherein the number of detectors is less than the number of electron beams emitted to the irradiation targets.

2. The electron beam applicator according to claim 1, wherein the number of detectors is one.

3. The electron beam applicator according to claim 2, wherein two or more light sources are provided, and excitation light beams emitted from respective light sources are emitted so that the excitation light beams are received by the photocathode at different timings.

4. The electron beam applicator according to claim 2, wherein one light source is provided, an excitation light beam emitted from the light source is divided into two or more, and the divided two or more excitation light beams are emitted so that the excitation light beams are received by the photocathode at different timings.

5. The electron beam applicator according to claim 2, wherein the electron beam applicator is a scanning electron microscope, an electron beam inspection device, an Auger electron spectrometer, a cathodoluminescence device, an X-ray analyzer, a transmission electron microscope, or a scanning transmission electron microscope.

6. The electron beam applicator according to claim 1, wherein two or more light sources are provided, and excitation light beams emitted from respective light sources are emitted so that the excitation light beams are received by the photocathode at different timings.

7. The electron beam applicator according to claim 6, wherein the electron beam applicator is a scanning electron microscope, an electron beam inspection device, an Auger electron spectrometer, a cathodoluminescence device, an X-ray analyzer, a transmission electron microscope, or a scanning transmission electron microscope.

8. The electron beam applicator according to claim 1, wherein one light source is provided, an excitation light beam emitted from the light source is divided into two or more, and the divided two or more excitation light beams are emitted so that the excitation light beams are received by the photocathode at different timings.

9. The electron beam applicator according to claim 8, wherein the electron beam applicator is a scanning electron microscope, an electron beam inspection device, an Auger electron spectrometer, a cathodoluminescence device, an X-ray analyzer, a transmission electron microscope, or a scanning transmission electron microscope.

10. The electron beam applicator according to claim 1, wherein the electron beam applicator is a scanning electron microscope, an electron beam inspection device, an Auger electron spectrometer, a cathodoluminescence device, an X-ray analyzer, a transmission electron microscope, or a scanning transmission electron microscope.

11. A creation method of detection data in an electron beam applicator, wherein the electron beam applicator includes at least one light source, a photocathode configured to generate releasable electrons in response to receiving an excitation light beam emitted from the light source, an anode configured to form an electric field between the photocathode and the anode and extract the releasable electrons by the formed electric field to form an electron beam, a detector configured to detect an emitted substance emitted from an irradiation target irradiated with the electron beam and generate a detection signal, and a control unit, the creation method of detection data comprising:

a step of setting two or more irradiation regions to be irradiated with an electron beam in the irradiation target in one detection data creation operation;

an electron beam forming step of forming two or more pulsed electron beams by emitting two or more excitation light beams from the light source to the photocathode, the two or more excitation light beams being pulsed and being set to be received by the photocathode at different timings;

an electron beam irradiation step of irradiating different irradiation regions selected from the set two or more irradiation regions with the two or more pulsed electron beams, respectively;

a detection step of detecting, at different timings by the detector, pulsed emitted substances emitted from the different irradiation regions in response to irradiation with the two or more pulsed electron beams and generating detection signals; and a detection data output step of outputting the generated detection signals in association with position information on the different irradiation regions, wherein the number of detectors is less than the number of electron beams emitted to the irradiation targets.

12. The creation method of detection data according to claim 11, wherein the number of detectors is one.

13. The creation method of detection data according to claim 12, wherein two or more light sources are provided, and excitation light beams emitted from respective light sources are emitted so that the excitation light beams are received by the photocathode at different timings.

14. The creation method of detection data according to claim 12, wherein one light source is provided, an excitation light beam emitted from the light source is divided into two or more, and the divided two or more excitation light beams are emitted so that the excitation light beams are received by the photocathode at different timings.

15. The creation method of detection data according to claim 12, wherein the electron beam applicator is a scanning electron microscope,
an electron beam inspection device,
an Auger electron spectrometer,
a cathodoluminescence device,
an X-ray analyzer,
a transmission electron microscope, or
a scanning transmission electron microscope.

16. The creation method of detection data according to claim 11, wherein two or more light sources are provided, and excitation light beams emitted from respective light sources are emitted so that the excitation light beams are received by the photocathode at different timings.

17. The creation method of detection data according to claim 16, wherein the electron beam applicator is a scanning electron microscope,
an electron beam inspection device,
an Auger electron spectrometer,
a cathodoluminescence device,
an X-ray analyzer,
a transmission electron microscope, or
a scanning transmission electron microscope.

18. The creation method of detection data according to claim 11, wherein one light source is provided, an excitation light beam emitted from the light source is divided into two or more, and the divided two or more excitation light beams are emitted so that the excitation light beams are received by the photocathode at different timings.

19. The creation method of detection data according to claim 18, wherein the electron beam applicator is a scanning electron microscope,
an electron beam inspection device,
an Auger electron spectrometer,
a cathodoluminescence device,
an X-ray analyzer,
a transmission electron microscope, or
a scanning transmission electron microscope.

20. The creation method of detection data according to claim 11, wherein the electron beam applicator is a scanning electron microscope,
an electron beam inspection device,
an Auger electron spectrometer,
a cathodoluminescence device,
an X-ray analyzer,
a transmission electron microscope, or
a scanning transmission electron microscope.

* * * * *